United States Patent
Iioka et al.

(10) Patent No.: US 7,339,825 B2
(45) Date of Patent: Mar. 4, 2008

(54) NONVOLATILE SEMICONDUCTOR MEMORY WITH WRITE GLOBAL BIT LINES AND READ GLOBAL BIT LINES

(75) Inventors: Osamu Iioka, Kawasaki (JP); Hiroshi Mawatari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/258,867

(22) Filed: Oct. 27, 2005

(65) Prior Publication Data

US 2006/0034141 A1    Feb. 16, 2006

Related U.S. Application Data

(63) Continuation of application No. PCT/JP03/10413, filed on Aug. 18, 2003.

(51) Int. Cl.
| | |
|---|---|
| G11C 16/02 | (2006.01) |
| G11C 8/16 | (2006.01) |
| G11C 8/12 | (2006.01) |
| G11C 7/18 | (2006.01) |
| G11C 16/06 | (2006.01) |

(52) U.S. Cl. ............................ 365/185.13; 365/185.11; 365/185.21; 365/185.22; 365/185.05; 365/189.04; 365/230.05

(58) Field of Classification Search ........... 365/185.02, 365/185.05, 185.11, 185.13, 189.04, 230.03, 365/230.05, 51, 63, 72, 185.21, 185.22
See application file for complete search history.

(56) References Cited

U.S. PATENT DOCUMENTS

| | | | | |
|---|---|---|---|---|
| 5,535,172 A | * | 7/1996 | Reddy et al. | 365/230.03 |
| 5,680,346 A | * | 10/1997 | Pathak et al. | 365/185.1 |
| 5,701,269 A | * | 12/1997 | Fujii | 365/210 |
| 5,847,998 A | * | 12/1998 | Van Buskirk | 365/185.33 |
| 5,894,437 A | | 4/1999 | Pellegrini | |
| 6,498,764 B1 | | 12/2002 | Won et al. | |
| 6,891,755 B2 | * | 5/2005 | Silvagni et al. | 365/185.13 |
| 2002/0117722 A1 | * | 8/2002 | Osada et al. | 257/379 |
| 2002/0131301 A1 | * | 9/2002 | Elmhurst | 365/185.11 |

FOREIGN PATENT DOCUMENTS

| | | |
|---|---|---|
| JP | 11-086576 | 3/1999 |
| JP | 11-144482 | 5/1999 |
| JP | 2000-149579 | 5/2000 |
| JP | 2003-157683 | 5/2003 |

* cited by examiner

Primary Examiner—J. H. Hur
(74) Attorney, Agent, or Firm—Arent Fox LLP

(57) ABSTRACT

A nonvolatile semiconductor memory is capable of dual and triple operation with a small chip size. A plurality of sectors is formed. Each sector has nonvolatile memory cells, local bit lines connected to these memory cells, and switch circuits. Write global bit lines and read global bit lines are each wired commonly to the sectors. The write global bit lines transfer write data to the memory cells or verify data from the memory cells. The read global bit lines transfer read data from the memory cells. The switch circuits connect the local bit lines to the write global bit lines or the read global bit lines in accordance with the operation modes. Consequently, it is possible to execute read operation while executing a write sequence or an erase sequence. That is, dual operation can be executed.

16 Claims, 14 Drawing Sheets

NONVOLATILE SEMICONDUCTOR MEMORY WITH WRITE GLOBAL BIT LINES AND READ GLOBAL BIT LINES

CROSS REFERENCE TO RELATED APPLICATIONS

This nonprovisional application is a continuation application of and claims the benefit of International Application No. PCT/JP03/10413, filed Aug. 18, 2003. The disclosure of the prior application is hereby incorporated herein in its entirety by reference.

BACKGROUND OF THE INVENTION

1. Field of the Invention

This invention relates to a nonvolatile semiconductor memory, and particularly to a nonvolatile semiconductor memory with which it is possible to execute read operation during erase operation or write operation.

2. Description of the Related Art

In a nonvolatile semiconductor memory such as a flash memory, the data write time and erase time are longer than the read time. When during write operation and erase operation of a nonvolatile semiconductor memory it is not possible to read out data, the performance of the system in which the nonvolatile semiconductor memory is mounted falls. To solve this problem, nonvolatile semiconductor memories having a plurality of banks that operate independently have been developed (for example Japanese Unexamined Patent Application Publication No. 11-86576).

In a nonvolatile semiconductor memory of this kind, during the execution of erase operation or write operation in one bank, it is possible to execute read operation in another bank (dual operation). However, with a single bank it is only possible to execute one operation at a time. By increasing the number of banks, it is possible to increase the number of memory regions that can be accessed at the same time; however, because the same sense amplifiers and write circuits are needed for each bank, when the number of banks increases, the chip size increases.

Also, triple operation, in which read operation, write operation and erase operation are executed simultaneously, cannot be executed with a 2-bank configuration. In related art, to execute triple operation, 3 or more banks have been necessary.

It is an object of the present invention to provide a nonvolatile semiconductor memory with which, while keeping any increase in chip size to a minimum, it is possible to execute read operation during the execution of erase operation or write operation.

It is another object of the invention to provide a nonvolatile semiconductor memory with which, while keeping any increase in chip size to a minimum, it is possible to execute read operation, write operation and erase operation simultaneously.

SUMMARY OF THE INVENTION

In a nonvolatile semiconductor memory provided by the invention, a plurality of sectors each have a plurality of nonvolatile memory cells, and local bit lines and switch circuits connected to these memory cells. Write global bit lines and read global bit lines are each wired commonly to all the sectors. The write global bit lines transfer write data to memory cells during write operation and transfer verify data from memory cells after write operation and after erase operation. The read global bit lines transfer read data from memory cells during read operation. The switch circuits connect local bit lines to write global bit lines or read global bit lines in accordance with operation modes. Consequently, it is possible to execute read operation using a read global bit line during the execution of a write sequence or an erase sequence using a write global bit line. That is, the dual operation is executed.

And, a plurality of global bit line pairs are each configured of one write global bit line and one read global bit line. A plurality of local bit line pairs is each configured by a pair of local bit lines. The global bit line pairs are wired along the local bit lines in correspondence with the local bit line pairs. For example, the write global bit line and the read global bit line of a global bit line pair are provided using a second wiring layer above a pair of local bit lines provided using a first wiring layer. Because of this, the write global bit lines and the read global bit lines can be formed within a region corresponding to the layout region of the sector. Accordingly, the layout size of the sectors can be prevented from depending on the wiring region of the global bit lines and becoming large. In other words, the layout size of the sectors can be minimized.

In another nonvolatile semiconductor memory provided by the invention, shield lines set to a predetermined voltage are respectively wired between the write global bit lines and the read global bit lines wired along the same direction. When a write operation and a read operation are executed simultaneously, different voltages are impressed on the write global bit line and the read global bit line. By forming the shield lines, it is possible to prevent interference such as cross-talk arising in the write global bit line and the read global bit line, and malfunctioning can be prevented.

In another nonvolatile semiconductor memory provided by the invention, the nonvolatile semiconductor memory has a plurality of banks capable of operating independently. Each of the banks has a plurality of sectors and write global bit lines and read global bit lines common to these sectors. The sectors each have a plurality of nonvolatile memory cells, and local bit lines and switch circuits connected to these memory cells. The write global bit lines transfer write data to the memory cells during a write operation and transfer verify data from the memory cells during a verify operation after the write operation and after the erase operation. The read global bit lines transfer read data from the memory cells during a read operation. The switch circuits connect the local bit lines to the write global bit lines and the read global bit lines in accordance with the operation modes. Because of this, in each bank, it is possible to execute the read operation using the read global bit line during the execution of a write sequence or an erase sequence using the write global bit line. For example, with two banks it is possible to execute the write sequence, the erase sequence and the read operation simultaneously. That is, it is possible to execute triple operation while keeping any increase in chip size to a minimum.

In another nonvolatile semiconductor memory provided by the invention, the nonvolatile semiconductor memory has a read sense amplifier common to all the banks. During the read operation, to amplify read data, the read sense amplifier is selectively connected to the read global bit line of a bank selected in accordance with an address signal. By the read sense amplifier common to all the banks being formed, the number of the sense amplifiers can be reduced and the chip size of the nonvolatile semiconductor memory can be reduced.

In another nonvolatile semiconductor memory provided by the invention, the switch circuits each have write global selection switches and read global selection switches. For example, the write global selection switch is a transfer transistor receiving a write decoding signal at its gate. And the read global selection switch is a transfer transistor receiving a read decoding signal at its gate. By means of the write global selection switch and the read global selection switch, the local bit line can be connected certainly to either a write global bit line or a read global bit line.

In another nonvolatile semiconductor memory provided by the invention, a write decoder generates in accordance with an address signal a write decoding signal for selectively turning on one of the write global selection switch during the write operation and during the verify operation. And a read decoder generates in accordance with the address signal the read decoding signal for selectively turning on one of the read global selection switch during the read operation. By forming each of the decoders for selecting the write global selection switch and the read global selection switch independently in correspondence with a respective operation mode, it is possible to design each of the decoders optimally. As a result, any increase in the chip size can be minimized and the decoding operation can be executed at high speed.

In another nonvolatile semiconductor memory provided by the invention, a write bit line selector connects any of the write global bit lines to a write data bus line in accordance with an address signal. The write bit line selector connects any of the write global bit lines to the write data bus line in accordance with the address signal. It is possible to execute read operation without malfunctioning while executing the write sequence or the erase sequence by forming the bit line selector and the data-bus line independently in accordance with the respective operation mode.

In another nonvolatile semiconductor memory provided by the invention, the write bit line selector has write switch transistors each for connecting the write global bit line to the write data bus line. And the read bit line selector has read switch transistors each for connecting the read global bit line to the read data bus line. Gate insulating films of the write switch transistors are thicker than each gate insulating films of the read switch transistors. Generally, in a nonvolatile semiconductor memory, the write voltage (a drain voltage of the memory cell) is higher than the read voltage (a drain voltage of the memory cell). Because of this, the gate insulating films of the read switch transistors can be formed to an optimal thickness in accordance with the voltage range to be applied. In other words, by a selector being provided for each operating mode, the gate insulating films can be formed to a thickness corresponding to the applied voltage range, and optimal write switch transistors and read switch transistors can be formed. As a result, the layout size of the read bit line selector can be made relatively small. And, because the switching speed of the read switch transistors can be increased, the read operating time can be shortened.

In another nonvolatile semiconductor memory provided by the invention, a verify sense amplifier amplifies verify data read out from any of the memory cells to the write global bit line during the verify operation after the write operation or after the erase operation. And a read sense amplifier amplifies read data read out to the read global bit line from any of the memory cell during the read operation. By forming the sense amplifiers independently in correspondence with the operation modes, it is possible to execute the read operation during the write sequence or the erase sequence without any malfunctioning.

In another nonvolatile semiconductor memory of the invention, the drivability of the read sense amplifier is larger than the drivability of the verify sense amplifier. Because of this, the read operating time can be shortened. And, because the verify sense amplifier can be made relatively small, the chip size of the nonvolatile semiconductor memory can be made small without its read performance being lowered.

In another nonvolatile semiconductor memory provided by the invention, each of the switch circuits has a local selection switch, a write global selection switch and a read global selection switch. The local selection switch turns on in accordance with an address signal and connects one of the local bit lines of the local bit line pair to a common node. The write global selection switch connects the common node to the write global bit line in accordance with the operation modes. The read global selection switch connects the common node to a read global bit line in accordance with the operation modes. By means of the local selection switch, the write global selection switch and the read global selection switch it is possible to connect each of the local bit lines of the local bit line pair to the write global bit line or the read global bit line, easily and certainly.

In another nonvolatile semiconductor memory provided by the invention, the write global bit line pairs are each configured of one write global bit line and one shield line. And the read global bit line pairs are each configured of one read global bit line and one shield line. The local bit line pairs are each configured by a pair of the local bit lines. The write global bit line pairs and the read global bit line pairs are wired along the local bit lines in correspondence with the local bit line pairs. For example, the write global bit line and the shield line of the write global bit line pair, and the read global bit line and the shield line of the read global bit line pair, are each wired using a second wiring layer above the local bit lines of a local bit line pair wired using a first wiring layer. In this case, the write global bit lines and the read global bit lines can be wired to conform to the layout region of the sectors. Therefore, the layout size of the sectors can be prevented from depending on the wiring region of the global bit lines and becoming large. In other words, the layout size of the sectors can be minimized.

In another nonvolatile semiconductor memory provided by the invention, a source line is provided independently for each sector. The sectors are smallest erase units for erasing data written to the memory cells. In this case, while executing the erase sequence on one sector, it is possible to execute the read operation on a different sector. Thus, the erase sequences and the read operation can be carried out simultaneously in sector units.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Preferred embodiments of the invention will be described below with reference to the drawings. The double circles in the figures represent external terminals. And in the figures, the signal lines shown with bold lines are a plurality of lines. Some of the blocks connected by bold lines are configured of a plurality of circuits. Signals supplied through the external terminals are denoted by the same symbols as the terminal names. Signal lines through which the signals pass are denoted by the same symbols as the signal names.

Figure 1:
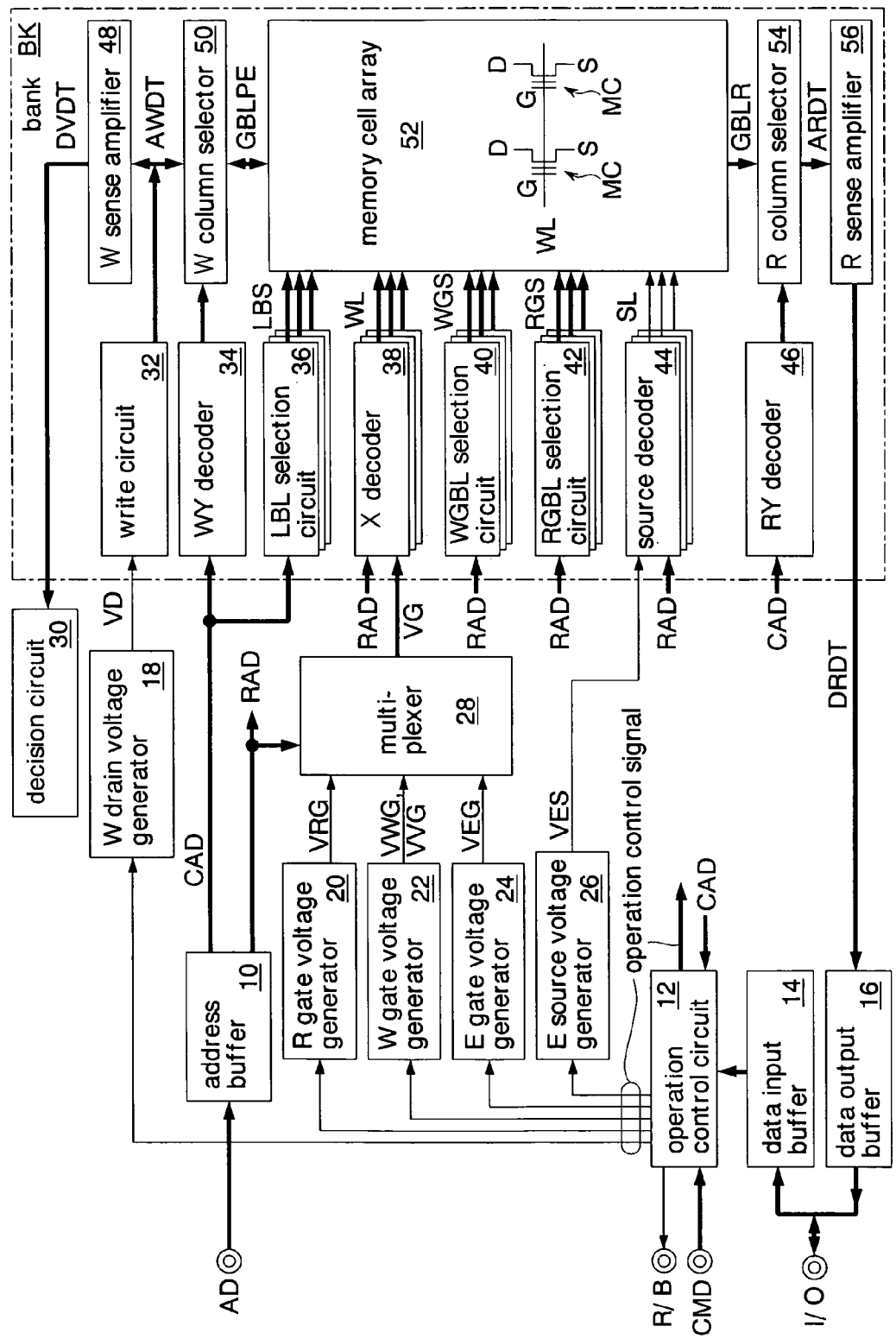
FIG. 1 is a block diagram showing a first embodiment of a nonvolatile semiconductor memory according to the invention.

FIG. 1 shows a first embodiment of a nonvolatile semiconductor memory according to the invention.

This semiconductor memory is formed as a flash memory having electrically rewritable nonvolatile memory cells, using a CMOS process on a silicon substrate. The flash memory is for example mounted on a system board of a mobile phone or the like along with a controller such as a CPU.

The flash memory has an address buffer 10, an operation control circuit (state machine) 12, a data input buffer 14, a data output buffer 16, a W drain voltage generator 18, an R gate voltage generator 20, a W gate voltage generator 22, an E gate voltage generator 24, an E source voltage generator 26, a multiplexer 28, a decision circuit 30 and a bank BK. The bank BK has a write circuit 32, a WY decoder 34, LBL selection circuits 36, X decoders 38, WGBL selection circuits 40, RGBL selection circuits 42, source decoders 44, an RY decoder 46, a W sense amplifier 48, a W column selector 50, a memory cell array 52, an R column selector 54 and an R sense amplifier 56.

The address buffer 10 receives an address signal AD through an address terminal AD and outputs a received address AD as a row address signal RAD and a column address signal CAD. The row address signal RAD is configured of high-order bits of the address signal AD. The row address signal RAD is used for the selection of word lines WL, which will be further discussed later. The column address signal CAD is configured of low-order bits of the address signal AD. The column address signal CAD is used for the selection of memory cells MC connected to the word lines WL. Further, the column address signal CAD is used as a command data at an input of an operation command.

The operation control circuit 12 determines an operating mode in correspondence with a command signal supplied through a command terminal CMD, a data signal supplied through a data terminal I/O, and the column address signal CAD, and generates operation control signals for controlling the operation of the flash memory as a whole. The operation control signals are supplied to the main circuits of the flash memory. As operating modes, there are a read operation mode, a write (program) operation mode and an erase operation mode. Each of the command terminals CMD receives, for example, a chip-enable signal /CE, a write-enable signal /WE and an output-enable signal /OE. When the bank BK is in the process of operating and cannot accept a new command signal CMD, the operation control circuit 12 changes a ready/busy signal R/B to a low level.

The data input buffer 14 receives write data and command data through the data terminal I/O. The data output buffer 16 outputs read data from the memory cell array 52 to the data terminal I/O.

During write operation (program operation), the W drain voltage generator 18 generates a write drain voltage VD (for example 5V) to be supplied to the drains D of memory cells MC of the memory cell array 52. And during verify operation after write operation and after erase operation, the W drain voltage generator 18 generates a verify drain voltage VD (for example 1V) to be supplied to the drains D of memory cells MC of the memory cell array 52.

The R gate voltage generator 20 generates a gate voltage VRG (for example 5V) to be supplied to the gates G of memory cells MC during read operation.

During write operation, the W gate voltage generator 22 generates a gate voltage VWG (for example 9V) to be supplied to the gates G of memory cells MC. And during verify operation after write operation and verify operation after erase operation, the W gate voltage generator 22 generates a gate voltage WG (for example 5V) to be supplied to the gates G of memory cells MC.

The E gate voltage generator 24 generates a gate voltage VEG (for example −9V) to be supplied to the gates G of memory cells MC during erase operation. The E source voltage generator 26 generates a source voltage VES (for example 5V) to be supplied to the sources S of memory cells MC during erase operation.

In this embodiment, the flash memory operates on a 3V power supply voltage. Because of this, the flash memory has a high voltage generator (not shown) for generating the drain voltage VD, the gate voltages VRG, VWG and WG and the source voltage VES, which are higher than the power supply voltage. And the flash memory has a negative voltage generator (not shown) for generating the gate voltage VEG, which is lower than the power supply voltage.

The multiplexer 28 selects one of the gate voltages VRG, VWG (or VVG) and VEG in accordance with the operating modes, and outputs the selected voltage as the gate voltage VG to an X decoder 38 indicated by the row address signal RAD. When the operation mode is the erase operation mode and a full-chip erase is ordered, the gate voltage VG (=VEG) is supplied to all of the X decoders 38.

During verify operation after write operation and after erase operation, the decision circuit 30 receives verify data DVDT (a digital signal) read out from object memory cell MC and decides whether a write sequence and an erase sequence can be ended. In other words, the decision circuit 30 is a verification circuit for determining that a threshold voltage of the memory cells MC has been set to a required value.

During write operation, the write circuit 32 outputs the drain voltage VD (write data) to the W column selector 50. In accordance with the column address signal CAD, the WY decoder 34 outputs a decoding signal for controlling the selection operation of the W column selector 50.

The W sense amplifier 48 (verify sense amplifier), during verify operation after write operation and after erase operation, amplifies data read out to an analog write data line AWDT through the W column selector 50, to convert it to digital data, and outputs amplified digital data to a digital verify data line DVDT.

The W column selector 50 (write bit line selector) has a plurality of column switches (nMOS transistors; write switch transistors) (not shown) connected to write global bit lines GBLPE. During write operation, and during verify operation after write operation and after erase operation, the W column selector 50 turns on the column switch corresponding to the decoding signal from the WY decoder 34 and connects the write global bit line GBLPE corresponding to the column address signal CAD to the analog write data line AWDT.

The gate insulating films (for example silicon dioxide) of the column switches (nMOS transistors) of the W column selector 50 are formed thicker than the gate insulating films of the column switches (nMOS transistors) of the R column selector 54, which will be further discussed later. In this embodiment, the voltage amplitude of a write global bit line GBLPE during write operation is 5V, and is five times the voltage amplitude of a read global bit line GBLR during read operation (1V). Because of this, reliability can be increased and yield can be increased by the gate insulating films pertaining to the write global bit lines GBLPE being made thick. With column selectors of related art, because they are used commonly for write operation and read operation, it has not been possible to make the gate insulating film of the column switches different for write use and for read use.

Figure 2:
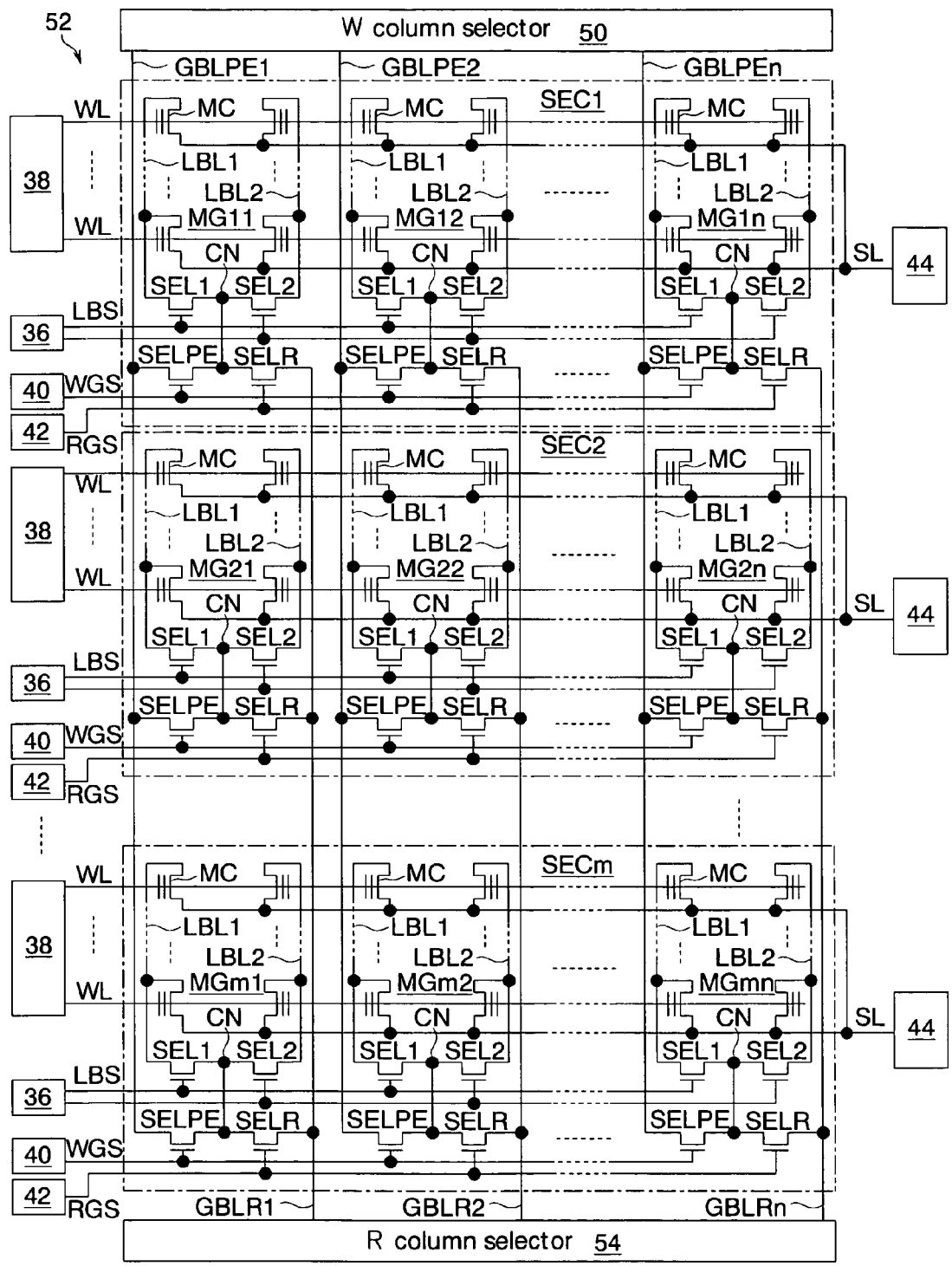
FIG. 2 is a circuit diagram showing details of a main part of a bank shown in FIG. 1.

The LBL selection circuits 36, in correspondence with the column address signal CAD, output selection signals LBS for selecting local bit lines LBL shown in FIG. 2. The X decoders 38 supply gate voltages VG to word lines WL selected in accordance with the row address signal RAD.

The WGBL selection circuits 40 (write decoders), during write operation or during erase operation, output a selection signal WGS (write decoding signal) for connecting the write global bit line GBLPE selected in accordance with the row address signal RAD to a local bit line LBL. The RGBL selection circuits 42 (read decoders), during read operation, output a selection signal RGS (read decoding signal) for connecting the read global bit line GBLR selected in accordance with the row address signal RAD to the local bit line LBL.

During read operation, during write operation and during verify operation, the source decoders 44 supply a source voltage (for example 0V) to a source line SL selected in accordance with the row address signal RAD. During erase operation, the source decoders 44 supply the source voltage VES from the E source voltage generator 26 to the source line SL selected in accordance with the row address signal RAD. The RY decoder 46 outputs a decoding signal for controlling the selection operation of the R column selector 54 in accordance with the column address signal CAD.

The R column selector 54 (read bit line selector) has a plurality of column switches (nMOS transistors; read switch transistors) (not shown) connected to the read global bit lines GBLR. During read operation, the R column selector 54 turns on the column switch corresponding to a decoding signal from the RY decoder 46 and thereby connects the read global bit line GBLR corresponding to the column address signal CAD to an analog read data line ARDT.

As mentioned above, the gate insulating film (for example silicon dioxide) of the column switches (nMOS transistors) of the R column selector 54 is formed thinner than the gate insulating film of the column switches of the W column selector 50. Specifically, the same transistors as those of logic circuits (peripheral circuits) are used in the R column selector 54. Because of this, the transistor size can be made small, and the switching speed of the column switches can be increased. As a result, the layout size of the R column selector 54 can be made small, and the read operating time can be shortened. And, when the transistor size of the column switches of the R column selector 54 is made about the same as that of the column switches of the W column selector 50, the ratio W/L of the gate width W to the channel length L can be made large and the switching speed of the column switches can be increased further. In other words, different column switches being formed for writing and for reading can design column switches having the optimal capacity for the respective operation.

During read operation, the R sense amplifier 56 (read sense amplifier) amplifies data read out to the analog read data line ARDT through the R column selector 54, to convert it to digital data, and outputs amplified read data to a digital read data line DRDT. The transistors constituting the R sense amplifier 56 are set to a higher drivability than the transistors constituting the W sense amplifier 48. Specifically, the ratio W/L of the gate width W to the channel length L of the transistors of the R sense amplifier 56 is set larger than in those of the W sense amplifier 48. Consequently, during read operation, the analog read data line ARDT, whose voltage changes are small, can be amplified at high speed, and the read operating time can be shortened.

On the other hand, in the W sense amplifier 48 used for verify operation, the same transistor size as in related art can be used, to minimize any increase in power consumption. With sense amplifiers of related art, because they are used commonly for read operation and verify operation, it has not been possible to make the transistor size of the sense amplifier different for reading and for verifying. Consequently, when the transistor size of a sense amplifier is made large in order to shorten the read operating time, the power consumed during verify operation also increases. By forming sense amplifiers for verify operation and read operation independently, as in this invention, it is possible to design sense amplifiers having the optimal capacity for their respective operations. And, when sense amplifiers for verify operation and for read operation are formed independently, it becomes possible to execute read operation during verify operation. That is, within a single bank BK, it becomes possible to execute read operation during a write sequence or during an erase sequence.

The memory cell array 52 has a plurality of memory cells MC having floating gates and control gates connected to a word line WL. The memory cell array 52 has an array structure generally referred to as NOR type. Details of the memory cell array 52 are shown in FIG. 2.

FIG. 2 shows details of a main part of the bank BK shown in FIG. 1.

The memory cell array 52 has a plurality of sectors SEC1 to SECm. The sectors SEC1 to SECm are smallest erase units for erasing data written to the memory cells MC. The X decoders 38, the LBL selection circuits 36, the WGBL selection circuits 40, the RGBL selection circuits 42 and the source decoders 44 are provided in correspondence with the sectors SEC1 to SECm.

The sectors SEC1 to SECm have a plurality of memory groups MG (MG11 to MGmn) each configured of a plurality of memory cells MC each connected to one of a pair of local bit lines LBL1, LBL2. The memory cells MC of each memory group MG have their control gates connected to the word line WL, their drains connected to a local bit line LBL1 or a local bit line LBL2, and their sources connected to a common source line SL of the respective sector SEC1 to SECm. The word lines WL are wired commonly to all the memory groups MG belonging to the same sector SEC.

The global bit lines GBLPE (GBLPE1-n), GBLR (GBLR1-n) are wired commonly to all the sectors SEC1 to SECm. The global bit lines GBPLE, GBLR are wired in the same direction as the local bit lines LBL1, LBL2. The global bit lines GBPLE1, GBLR1 are connected commonly to the memory groups MG11, 21, . . . , m1. Similarly, the global bit lines GBLPEn, GBLRn are connected commonly to the memory groups MG1n, 2n, . . . , mn.

As a result of common global bit lines GBLPE, GBLR being wired to the sectors SEC1 to SECm, it becomes possible for any two of the sectors SEC1 to SECm independently to execute, respectively, read operation and write operation, read operation and erase operation, read operation and verify operation after write operation, or read operation and verify operation after erase operation.

In each of the memory groups MG, the local bit lines LBL1, LBL2 are connected to a common node CN via respective selection switches SEL1, SEL2 (local selection switches) configured by nMOS transistors. Either of the selection switches SEL1, SEL2 is turned on in accordance with a selection signal LBS from a respective LBL selection circuit 36 received at its gate. When the selection switch SEL1 is on, the memory cells MC connected to the local bit line LBL1 are accessed. When the selection switch SEL2 is on, the memory cells MC connected to the local bit line LBL2 are accessed.

In each of the memory groups MG, the global bit line GBLPE is connected to the common node CN via a selection switch SELPE (write global selection switch) configured by an nMOS transistor. During write operation and during verify operation after write operation and erase operation, the selection switch SELPE turns on in accordance with a selection signal WGS from the WGBL selection circuit 40 received at its gate. The global bit line GBLR is connected to the common node CN via a selection switch SELR (read global selection switch) configured by an nMOS transistor. During read operation, the selection switch SELR turns on in accordance with a selection signal RGS from the RGBL selection circuit 42 received at its gate. In this way, the selection switches SEL1, SEL2, SELPE and SELR make up a switch circuit for connecting the local bit lines LBL to the global bit line GBLPE or GBLR in accordance with the operation mode.

For example by making the drivability of the selection switch SELR relatively larger than the drivability of the selection switch SELPE, it is possible to increase the switching speed of the selection switch SELR without increasing the layout size of the memory group MG. As a result, the read operating time can be shortened.

Figure 3:
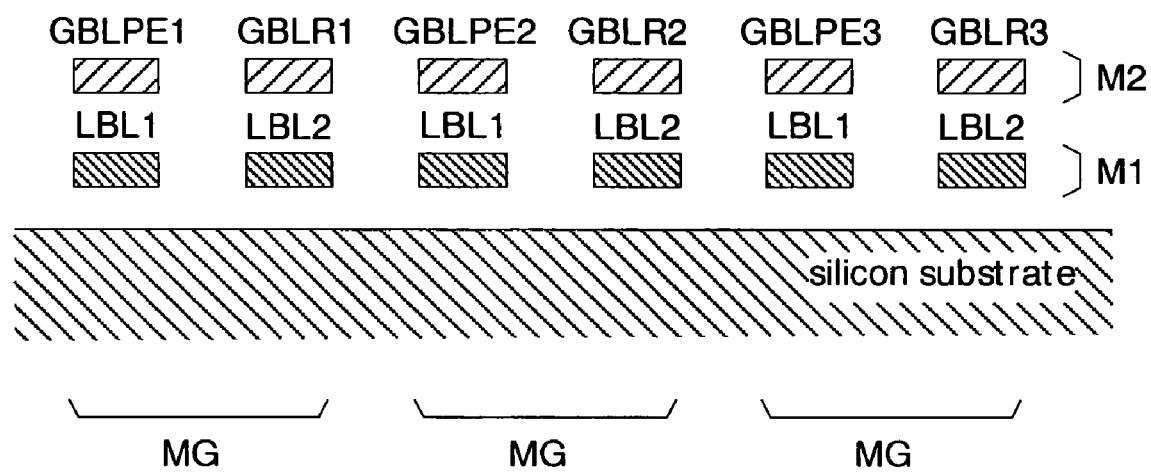
FIG. 3 is a sectional view showing a wiring structure of a memory cell array shown in FIG. 2.

FIG. 3 shows the wiring structure of the memory cell array 52.

In this embodiment, the local bit lines LBL1, LBL2 are formed using a first metal layer M1 (first wiring layer). The first metal layer M1 is the nearest metal wiring layer to the silicon substrate. The global bit lines GBLPE, GBLR are wired using a second metal layer M2 (second wiring layer) above the first metal layer M1. The global bit lines GBLPE, GBLR are wired above the local bit lines LBL1, LBL2 respectively.

By forming the pair of local bit lines LBL1, LBL2 (local bit line pair) within the memory group MG, where the pair of global bit lines GBLPE, GBLR (global bit line pair) are wired, it is possible to make the wiring widths of the global bit lines GBLPE, GBLR and the local bit lines LBL1, LBL2 the same, and it is possible to make their wiring spacings the same. Because the global bit lines GBLPE, GBLR and the local bit lines LBL1, LBL2 can be wired in an orderly fashion, the wiring efficiency of the memory cell array 52 can be increased and size of the memory cell array 52 can be made small. In other words, it is possible to minimize the layout size of the memory cell array 52 and to wire the global bit lines GBLPE, GBLR and the local bit lines LBL1, LBL2 with good efficiency.

Figure 4:
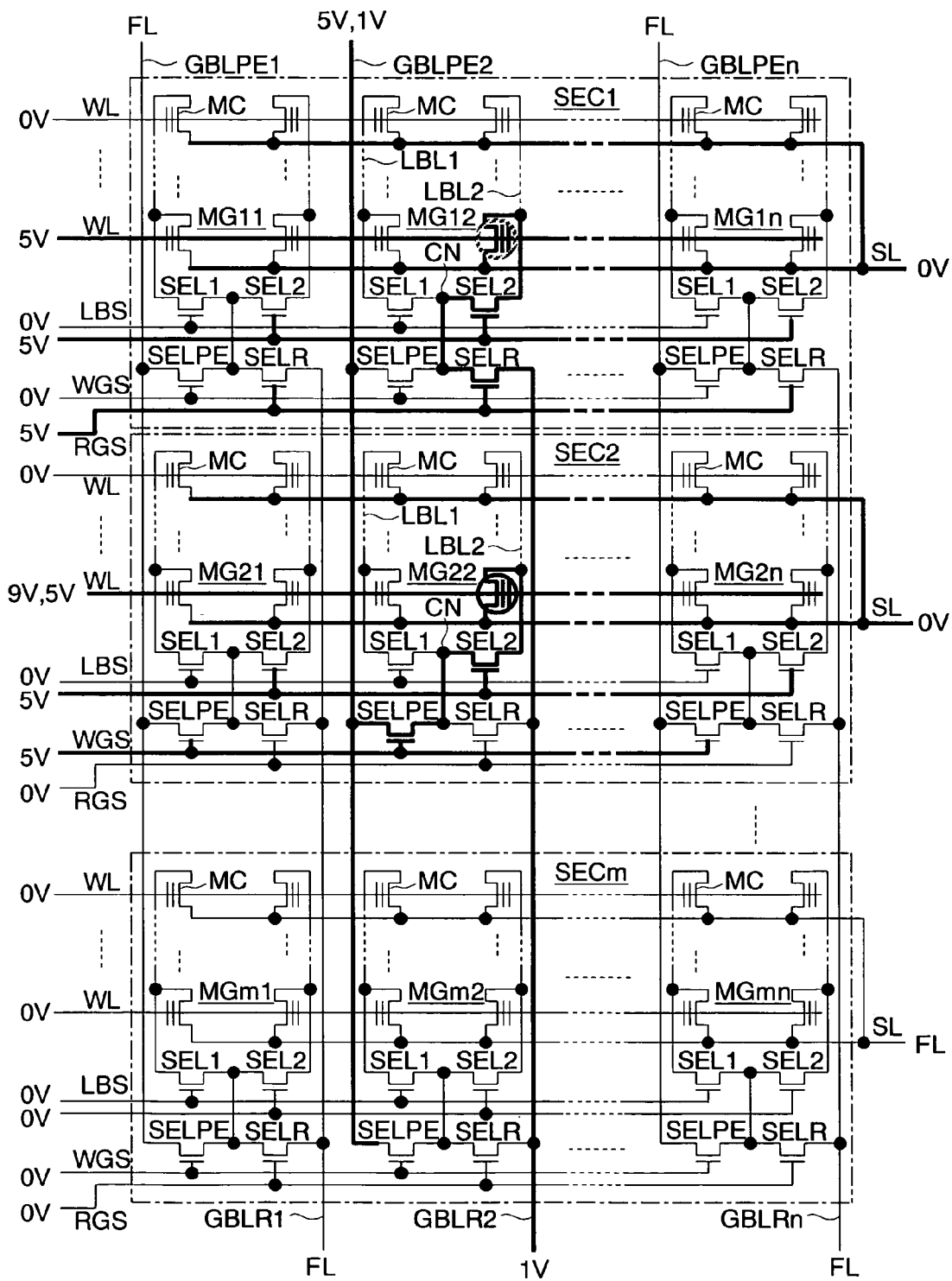
FIG. 4 is an explanatory view showing an example of a flash memory operation of the first embodiment.

FIG. 4 shows an example of the operation of the flash memory of the first embodiment. The thick lines in the figure show signal lines undergoing voltage changes, and transistors operating, in connection with memory operation.

In this example, while data is being written to the memory cell MC (hereinafter also referred to as the write cell) circled in the memory group MG22 of the sector SEC2, data is read out from the memory cell MC (hereinafter also referred to as the read cell) circled with a broken line in the memory group MG12 in the sector SEC1 (a so-called dual operation function). The writing of data is carried out by means of a write sequence in which write operation and verify operation are repeated.

First, to execute write operation, the word line WL connected to the write cell in the memory group MG22 is set to 9V (the write gate voltage VWG). The other word lines WL of the sector SEC2 are set to 0V (the unselected state). 5V (the write drain voltage VD) is supplied to the global bit line GBLPE2 corresponding to the memory group MG22. The write drain voltage VD is supplied to the memory cell array 52 via the write circuit 32 and the W column selector 50 shown in FIG. 1. The source line SL of the sector SEC2 is set to 0V (the write source voltage).

The selection signal LBS corresponding to the selection switch SEL2 of the memory group MG22 is set to 5V, and the selection signal LBS corresponding to the selection switch SEL1 is set to 0V. Consequently, the selection switch SEL2 turns on and the selection switch SEL1 turns off. The selection signal WGS corresponding to the selection switch SELPE is set to 5V, and the selection signal RGS corresponding to the selection switch SELR is set to 0V. Consequently, the selection switch SELPE turns on and the selection switch SELR turns off. As a result of the selection switches SELPE and SEL2 turning on, the write drain voltage VD on the global bit line GBLPE2 is fed to the drain of the write cell. And, write operation of the write cell is executed.

The voltage of the selected word line WL (5V) is also supplied to the gates of the memory cells MC of the other memory groups MG (MG21 and so on) neighboring the memory group MG22 in the sector SEC2. The 5V selection signal LBS is also supplied to the selection switches SEL2 of the neighboring other memory groups MG. Similarly, the 5V selection signal WGS is also supplied to the selection switches SELPE of the neighboring other memory groups MG. However, because the corresponding global bit lines GBLPE1 etc. are in a floating state FL, write operation is not executed on the memory cells MC of the other memory groups MG. That is, writing of data is executed only on the write cell.

After the writing of data to the write cell, a verify operation is executed as follows. First, the word line WL connected to the write cell is set to 5V (the verify gate voltage VVG). The other word lines WL of the sector SEC2 are set to 0V (the unselected state). 1V (the verify drain voltage VD) is supplied to the global bit line GBLPE2 corresponding to the memory group MG22. The verify drain voltage VD is supplied to the memory cell array 52 via the write circuit 32 and the W column selector 50 in the same way as the write drain voltage VD. The source line SL of the sector SEC2 is set to 0V (the write source voltage).

After that, as in write operation, the selection switches SELPE, SEL2 are turned on and the verify drain voltage VD on the global bit line GBLPE2 is fed to only the drain of the write cell. Then, the W sense amplifier 48 shown in FIG. 1 operates and a logic value (threshold voltage) written to the write cell is determined in correspondence with the current flowing through the global bit line GBLPE2. When the write is complete, the write sequence is finished. When writing is incomplete, write operation and verify operation are executed again.

Meanwhile, to execute read operation, the word line WL connected to the read cell in the memory group MG12 is set to 5V (the read gate voltage VRG). The other word lines WL of the sector SEC1 are set to 0V (the unselected state). 1V (the read drain voltage) is supplied to the global bit line GBLR2 corresponding to the memory group MG12. The source line SL of the sector SEC1 is set to 0V (the read source voltage).

The selection signal LBS corresponding to the selection switch SEL2 of the memory group MG12 is set to 5V, and the selection signal LBS corresponding to the selection switch SEL1 is set to 0V. Consequently, the selection switch SEL2 turns on and the selection switch SEL1 turns off. The selection signal RGS corresponding to the selection switch SELR is set to 5V, and the selection signal WGS corresponding to the selection switch SELPE is set to 0V. Consequently, the selection switch SELR turns on and the selection switch SELPE turns off. As a result of the selection switches SELR, SEL2 turning on, the read drain voltage on the global bit line GBLR2 is fed to the drain of the read cell. Then, the R sense amplifier 56 shown in FIG. 1 operates and a logic value (threshold voltage) of read data is determined in correspondence with the current flowing through the global bit line GBLR2. The determined read data is outputted to the data terminals I/O.

The 5V of the word line WL is also supplied to the gate of memory cells MC of the other memory groups MG (MG11 and so on) neighboring the memory group MG12 in the sector SEC1. The 5V selection signal LBS is also supplied to the selection switches SEL2 of the neighboring other memory groups MG. Similarly, the 5V selection signal WGS is also supplied to the selection switches SELR of the neighboring other memory groups MG. However, because the corresponding global bit lines GBLR1 etc. are in a floating state FL, read operation is not executed on the memory cells MC of the other memory groups MG. By supplying the read drain voltage to a plurality of global bit lines GBLR simultaneously, it is possible to the read data of a plurality of bits from the same sector SEC in one read operation.

The word lines WL of the sectors SEC (for example SECm) where write operation (including verify operation) and read operation are not being executed are set to 0V (the unselected state). Consequently, the memory cells MC of these sectors SEC are not accessed.

Figure 5:
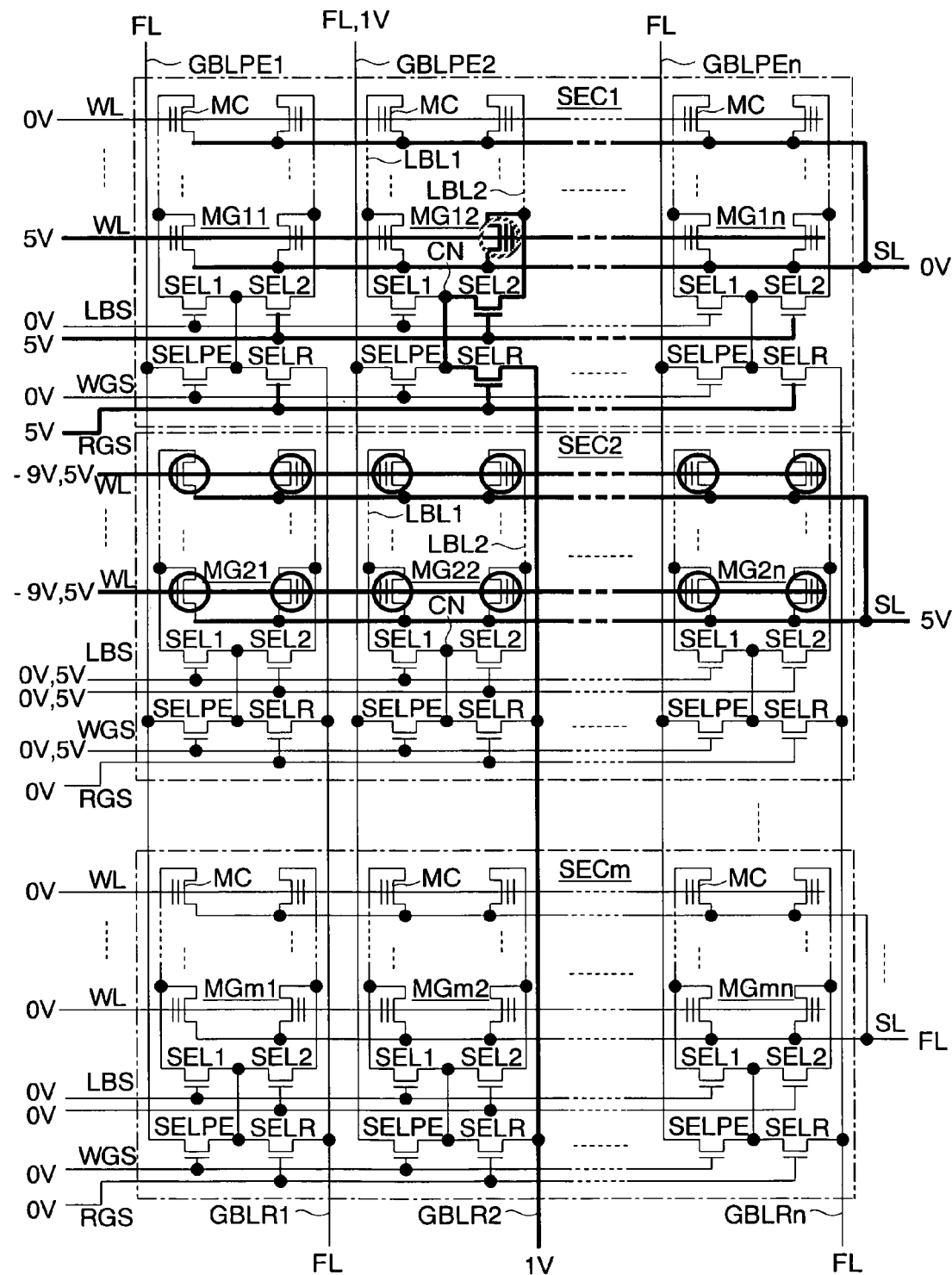
FIG. 5 is an explanatory view showing another example of a flash memory operation of the first embodiment.

FIG. 5 shows another example of operation of the flash memory of the first embodiment. The thick lines in the figure show signal lines undergoing voltage changes, and transistors operating, in connection with memory operation. Operations the same as in FIG. 4 will not be described again in detail.

In this example, while the data of all of the memory cells MC circled in the sector SEC2 (hereinafter also referred to as the erase cells) is being erased, the data from the memory cell MC circled with a broken line in the memory group MG12 of the sector SEC2 (hereinafter also referred to as the read cell) is read out (a so-called dual operation function). The erasing of data is carried out by means of an erase sequence in which erase operation and verify operation are repeated.

First, to execute erase operation, the word lines WL connected to the erase cells (all the word lines WL of the sector SEC2) are set to −9V (the erase gate voltage VEG). The global bit lines GBLPE1-n are all set to the floating state FL. The source line SL connected to the erase cells is set to 5V (the erase source voltage).

The selection signals LBS corresponding to the selection switches SEL1, SEL2 of the memory group MG22 are both set to 0V, and the selection switches SEL1, SEL2 turn off. Similarly, the selection signals WGS, RGS corresponding to the selection switches SELPE, SELR of the memory group MG22 are both set to 0V, and the selection switches SELPE, SELR turn off. All of the memory cells MC in the sector SEC2 receive −9V and 5V at their gates and sources respectively, and their data is erased.

A verify operation after the erase operation is carried out on all of the memory cells MC in the sector SEC2. Because the verify operation on each of the memory cells MC is the same as the verify operation of FIG. 4 described above, it will not be described again here. The read operation is also the same as that of FIG. 4 described above and will not be described again here.

Thus, in this embodiment, as a result of common global bit lines GBLPE, GBLR being wired to the sectors SEC1 to SECm, it is possible to execute read operation during the execution of the write sequence or the erase sequence. That is, the duel operation can be executed with a single bank BK.

By means of the selection switches SELPE, SELR it is possible to connect the local bit line LBL1 or the local bit line LBL2 certainly to one of the global bit lines GBLPE, GBLR.

As a result of the WGBL selection circuits 40 and the RGBL selection circuits 42 being formed independently for the respective operation modes, the selection signals WGS, RGS for turning on the selection switches SELPE, SELR can be generated easily in correspondence with the row address signal RAD. Consequently, the decoding operation of the WGBL selection circuit 40 and the RGBL selection circuit 42 can be made high-speed. As a result, write operation, erase operation and read operation can be executed at high speed.

As a result of the W column selector 50 and the R column selector 54 being formed independently for the respective operation modes, the read operation can be executed without any malfunctioning during the execution of the write sequence or the erase sequence. Similarly, as a result of the W sense amplifier 48 and the R sense amplifier 56 being provided respectively for verify operation and read operation to be executed independently, the read operation can be executed without any malfunctioning during the execution of the write sequence or the erase sequence.

By making the gate insulating films of the column switches of the W column selector 50 thicker than the gate insulating films of the column switches of the R column selector 54, it is possible to make the layout size of the R column selector 54 relatively small. And because the switching speed of the column switches of the R column selector 54 can be increased, the read operating time can be shortened.

By forming the W sense amplifier 48 and the R sense amplifier 56 respectively in correspondence with verify operation and read operation to be executed independently, it is possible to execute read operation without any malfunctioning during the execution of the write sequence or the erase sequence.

By making the drivability of the R sense amplifier 56 greater than the drivability of the W sense amplifier 48, it is possible to shorten the read data amplification time and to shorten the read operation time. Because only the drivability of the W sense amplifier 48 is made relatively small, it is possible to make the chip size of the flash memory small without reducing its read performance.

By wiring the global bit lines GBLPE, GBLR in correspondence with the local bit lines pairs LBL1, LBL2, it is possible to prevent the layout size of each of the sectors SEC1 to SECm from depending on the wiring area of the global bit lines GBLPE, GBLR and becoming large, and the layout size of the sectors SEC1 to SECm can be made a minimum size depending only on the devices such as the memory cells MC.

By forming the selection switches SEL1, SEL2 it is possible to connect one of the local bit lines LBL1, LBL2 to the global bit line GBLPE or the global bit line GBLR easily and certainly.

By wiring the source line SL independently for each of the sectors SEC1 to SECm, it is possible to execute the write sequences, the erase sequences and the read operations for each of the sectors SEC1 to SECm.

Figure 6:
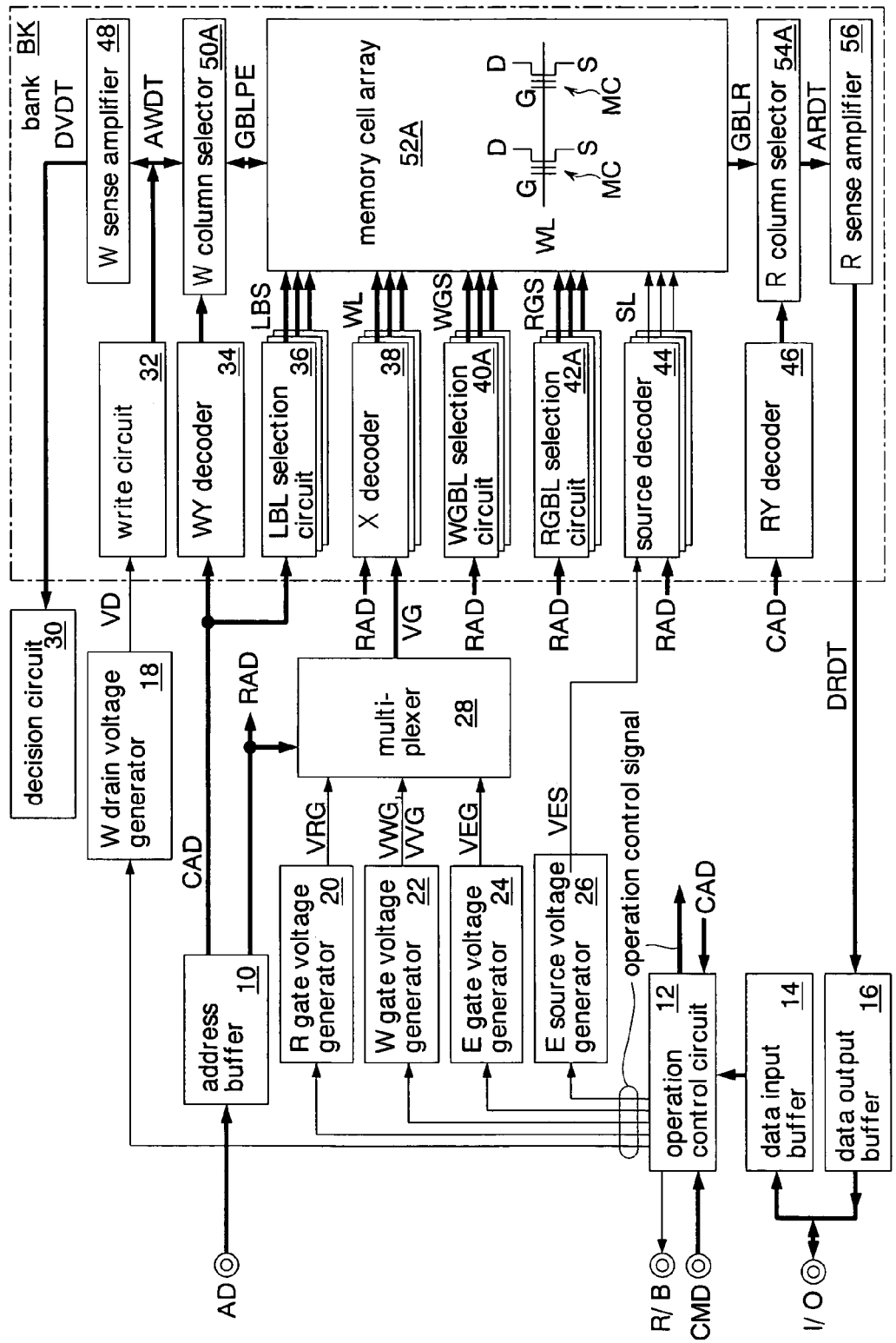
FIG. 6 is a block diagram showing a second embodiment of a nonvolatile semiconductor memory according to the invention.

FIG. 6 shows a second embodiment of a nonvolatile semiconductor memory according to the invention. Circuits/signals the same as circuits/signals described in the first embodiment have been given the same reference numerals and will not be described in detail again.

In this embodiment, WGBL selection circuits 40A, RGBL selection circuits 42A, a W column selector 50A, a memory cell array 52A and an R column selector 54A are formed instead of the WGBL selection circuits 40, RGBL selection circuits 42, W column selector 50, memory cell array 52 and R column selector 54 of the first embodiment. The numbers of bits of the selection signals WGS, RGS that the WGBL selection circuits 40A and RGBL selection circuits 42A output are larger than in the first embodiment. The number of global bit lines GBLPE, GBLR connected to the W column selector 50A and the R column selector 54A is smaller than in the first embodiment. The rest of the construction is substantially the same as that of the first embodiment.

Figure 7:
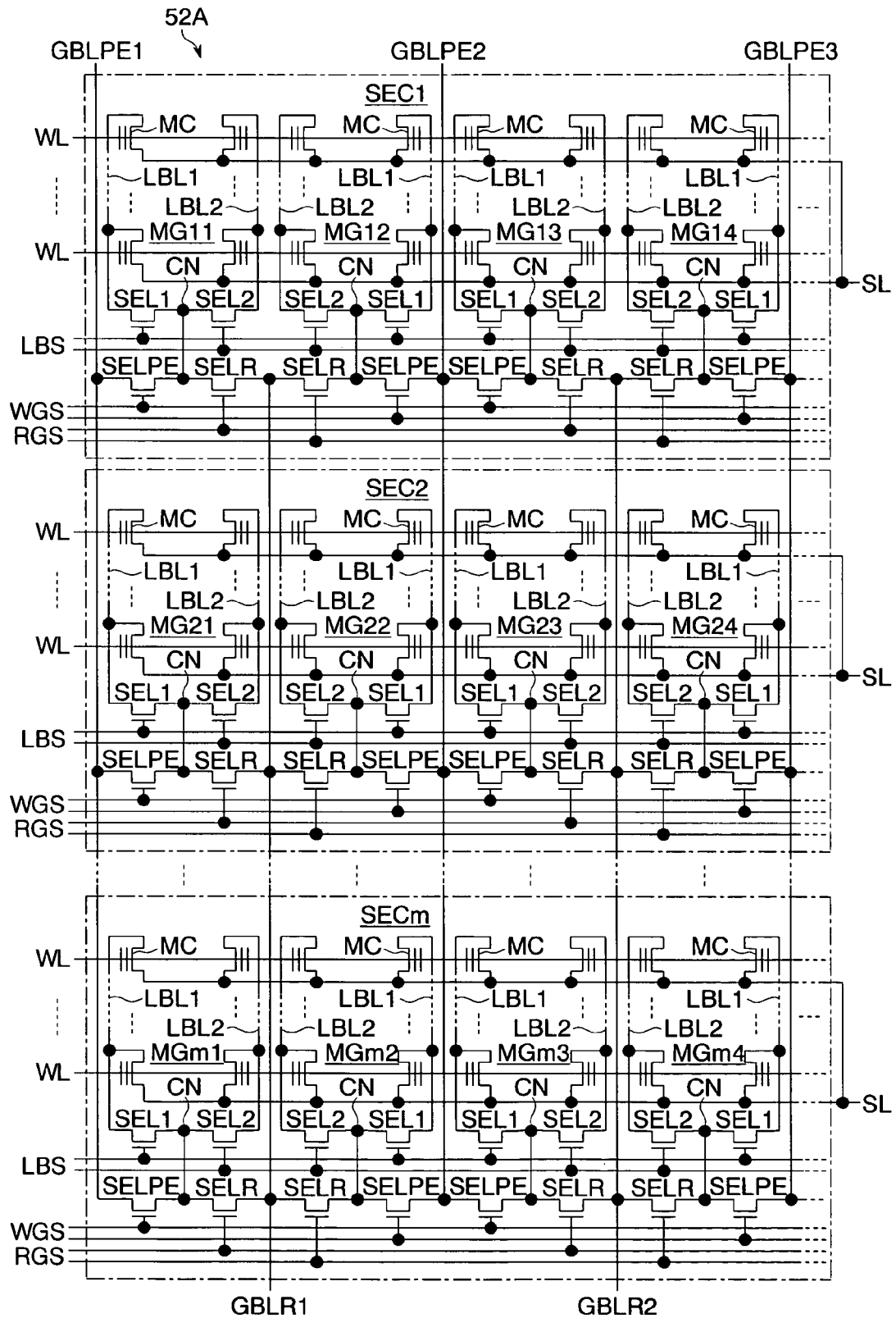
FIG. 7 is a circuit diagram showing details of a main part of a bank shown in FIG. 6.

FIG. 7 shows details of a main part of the bank BK shown in FIG. 6.

The memory cell array 52A, like the first embodiment, has a plurality of sectors SEC1 to SECm. One global bit line GBLPE serves two mutually adjacent memory groups MG. Because each global bit line GBLPE is connected to either of two memory groups MG, the selection switches SELPE of these memory groups MG are connected to mutually different selection signals WGS. That is, two selection signal lines WGS are wired for each of the sectors SEC1 to SECm.

And, one global bit line GBLR serves two mutually adjacent memory groups MG. Because each global bit line GBLR is connected to either of two memory groups MG, the selection switches SELR of these memory groups MG are connected to mutually different selection signals RGS. That is, two selection signal lines RGS are wired for each of the sectors SEC1 to SECm.

The rest of the construction of the memory cell array 52A is the same as in the first embodiment. As a result of the global bit lines GBLPE, GBLR each being provided commonly for two memory groups, only one global bit lines GBLPE or GBLR is wired per local bit line pair LBL1, LBL2. Consequently, the wiring number of the global bit lines GBLPE, GBLR provided becomes approximately half of that in the first embodiment. More specifically, when the wiring number of the local bit lines LBL1, LBL2 is written N, the wiring number of the global bit lines GBLPE, GBLR is N/4+1 of each, and the total wiring number of the global bit lines GBLPE, GBLR is N/2+2.

Figure 8:
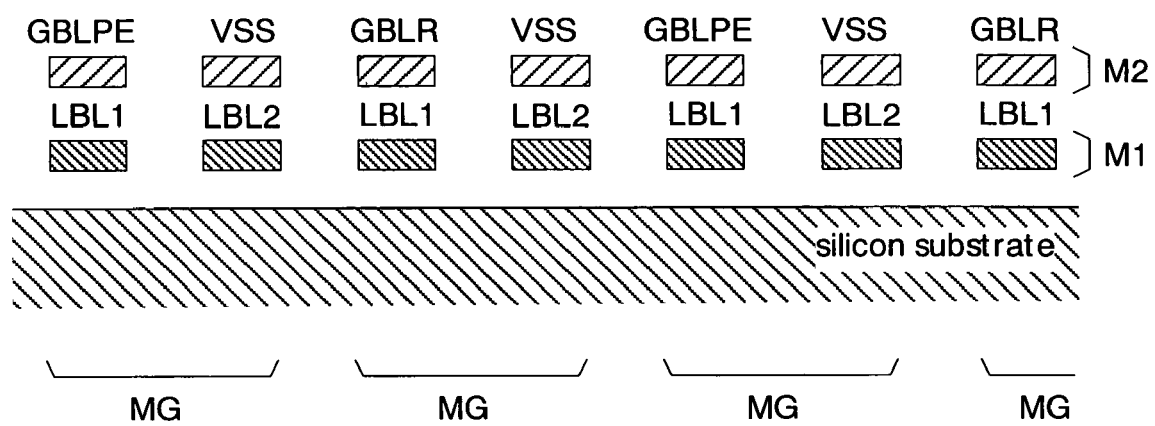
FIG. 8 is a sectional view showing a wiring structure of a memory cell array shown in FIG. 7.

FIG. 8 shows the wiring structure of the memory cell array 52A.

In this embodiment, because the number of wiring of the global bit lines GBLPE, GBLR decreases, spaces of these wirings are used to provide shield lines (ground lines VSS). The global bit line GBLPE and a shield line VSS form a write global bit line pair, and a global bit line GBLR and a shield line VSS form a read global bit line pair. The write global bit line pairs and the read global bit line pairs are wired directly above the local bit line pairs LBL1, LBL2. The global bit lines GBLPE, GBLR and the shield lines VSS are wired using the second metal layer M2, and the local bit lines LBL1, LBL2 are wired using the first metal layer M1.

In this embodiment, as mentioned above, the wiring number of global bit lines GBLPE, GBLR can be made approximately half of that in the first embodiment. Consequently, using the second metal layer M2, it is possible to wire shield lines VSS between the global bit lines GBLPE, GBLR. As the shield lines, alternatively for example other power supply lines at a fixed voltage may be wired.

By wiring the shield lines VSS, it is possible to prevent interference such as cross-talk, even when the write operation and the read operation are executed simultaneously using adjacent global bit lines GBLPE, GBLR. In particular, as shown in the first embodiment, the voltage amplitude of a global bit line GBLPE during write operation is 5V and is five times the voltage amplitude of a global bit line GBLR during the read operation (1V). Consequently, it is possible to prevent the global bit lines GBLR from suffering influences of the global bit lines GBLPE and read data being destroyed.

In this embodiment also, it is possible to obtain the same effects as those of the first embodiment described above. Also, in this embodiment, by the shield lines VSS being wired between the global bit lines GBLPE and the global bit lines GBLR, it is possible to prevent interference such as cross-talk from arising in the global bit lines GBLPE and the global bit lines GBLR, and malfunctioning can be prevented. In particular, it is possible to prevent read data on the global bit lines GBLR from being destroyed.

Figure 9:
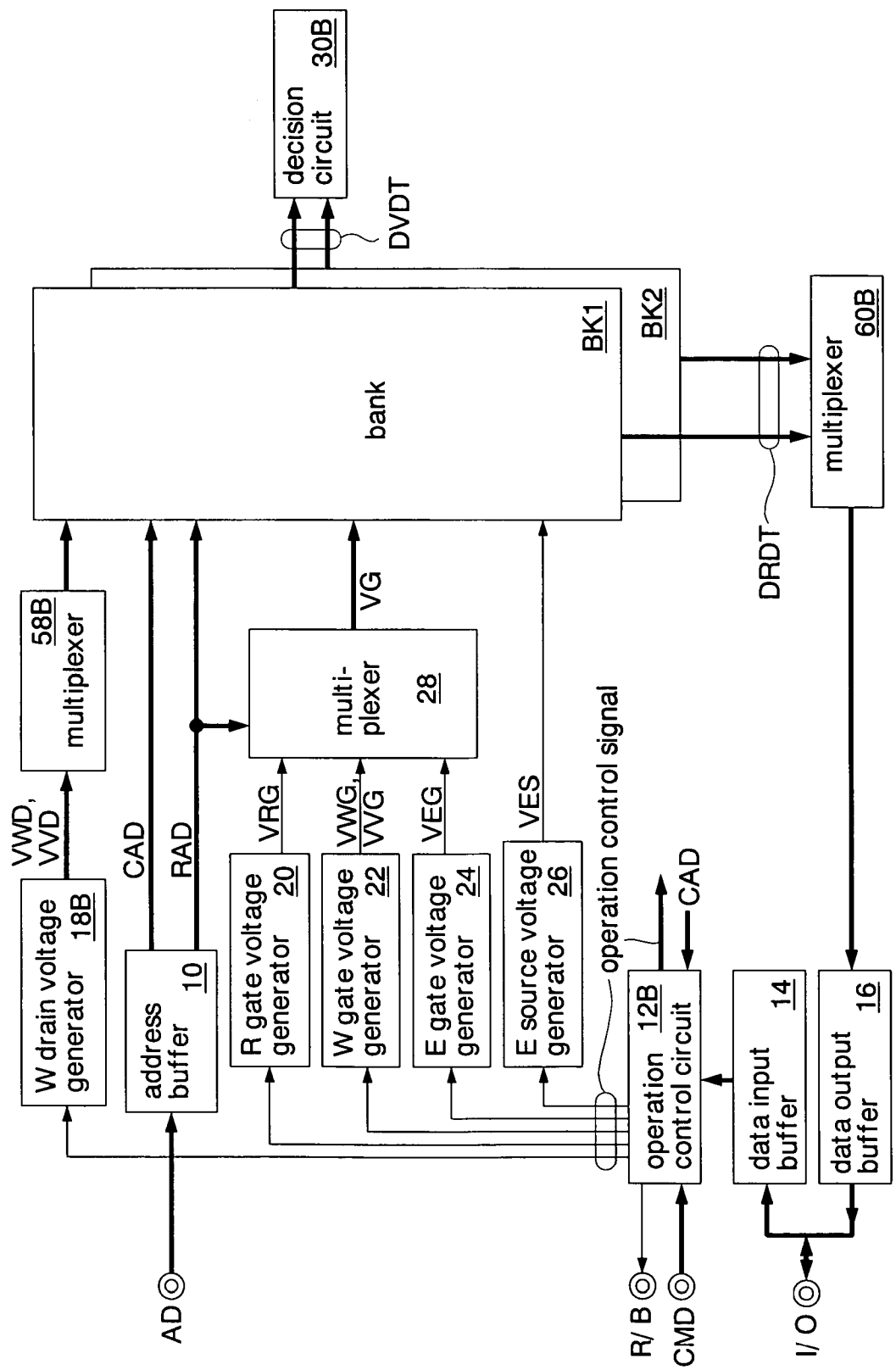
FIG. 9 is a block diagram showing a third embodiment of a nonvolatile semiconductor memory according to the invention.

FIG. 9 shows a third embodiment of a nonvolatile semiconductor memory according to the invention. Circuits/signals the same as circuits/signals described in the first embodiment have been given the same reference numerals and will not be described in detail again.

In this embodiment, the flash memory has two banks BK1, BK2. And an operation control circuit 12B, a W drain voltage generator 18B and a decision circuit 30B are formed instead of the operation control circuit 12, the W drain voltage generator 18 and the decision circuit 30 of the first embodiment. A multiplexer 58B is formed between the W drain voltage generator 18B and the banks BK1, BK2. A multiplexer 60B is formed between the banks BK1, BK2 and the data output buffer 16. The rest of the construction is substantially the same as the first embodiment.

The operation control circuit 12B, in addition to the functions of the operation control circuit 12 of the first embodiment, has a function of operating the banks BK1, BK2 independently. The W drain voltage generator 18B generates a write drain voltage VWD and a verify drain voltage WD. During write operation and during verify operation, the multiplexer 58B outputs the write drain voltage VWD or the verify drain voltage VVD to an operating bank BK (BK1 or BK2) in correspondence with the row address signal RAD.

To execute at least one of the read operation, the write operation and the erase operation independently from each other, the banks BK1, BK2 each receive the row address signal RAD, the column address signal CAD, the gate voltage VG and the erase source voltage VES.

Figure 10:
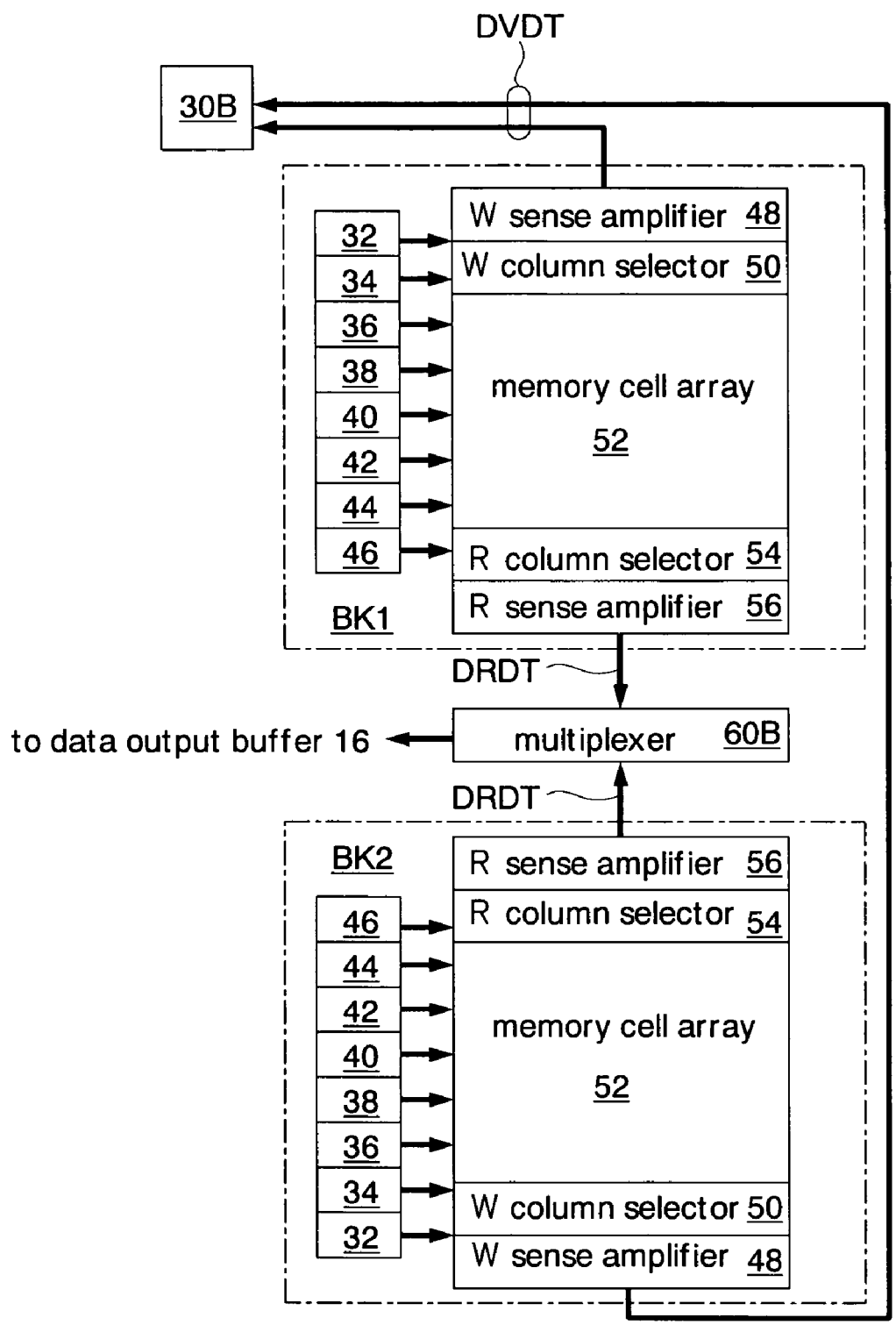
FIG. 10 is a block diagram showing details of a bank shown in FIG. 9.

FIG. 10 shows the details of the banks BK1, BK2 shown in FIG. 9.

The banks BK1, BK2 are each the same as the bank BK of the first embodiment. That is, the banks BK1, BK2 each have a write circuit 32, a WY decoder 34, LBL selection circuits 36, X decoders 38, WGBL selection circuits 40, RGBL selection circuits 42, source decoders 44, an RY decoder 46, a W sense amplifier 48, a W column selector 50, a memory cell array 52, an R column selector 54 and an R sense amplifier 56.

The decision circuit 30B receives verify data DVDT from each of the banks BK1, BK2 and decides for each of the banks BK1, BK2 whether the write sequence and the erase sequence can be ended. The multiplexer 60B outputs to the data output buffer 16 a digital read data signal DRDT outputted from the R sense amplifier 56 (see FIG. 1) of the bank BK1 or BK2 executing read operation.

In this embodiment, the banks BK1, BK2 can each execute the read operation independently during the write sequence or during the erase sequence. Consequently, so-called triple operation can be executed in the two banks BK1, BK2.

In this embodiment also, it is possible to obtain the same effects as those of the first embodiment. Also, in this embodiment, by two banks BK1, BK2 being formed each having write/erase circuits and read circuits and having the global bit lines GBLPE, GBLR common to their sectors SEC, so-called triple operation can be executed.

Figure 11:
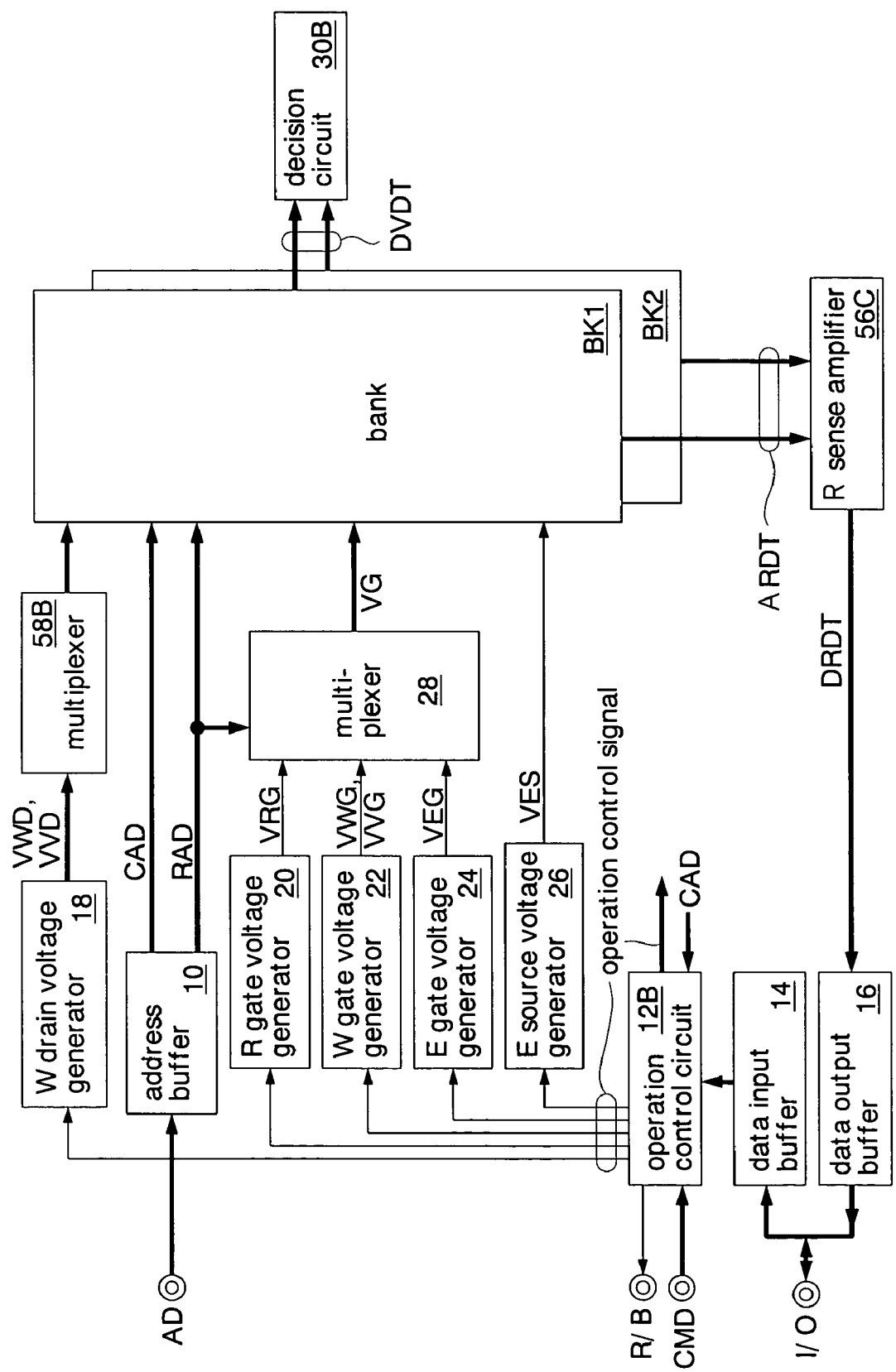
FIG. 11 is a block diagram showing a fourth embodiment of a nonvolatile semiconductor memory according to the invention.

FIG. 11 shows a fourth embodiment of a nonvolatile semiconductor memory according to the invention. Circuits/signals the same as circuits/signals described in the first, second and third embodiments have been given the same reference numerals and will not be described in detail again.

In this embodiment, the flash memory has two banks BK1, BK2. The banks BK1, BK2 each have the construction of the bank BK of the second embodiment without the R sense amplifier 56. An R sense amplifier 56C common to the banks BK1, BK2 is formed instead of the R sense amplifier 56. A circuit equivalent to the multiplexer 60B of the third embodiment is not provided. The rest of the construction is substantially the same as the third embodiment.

Figure 12:
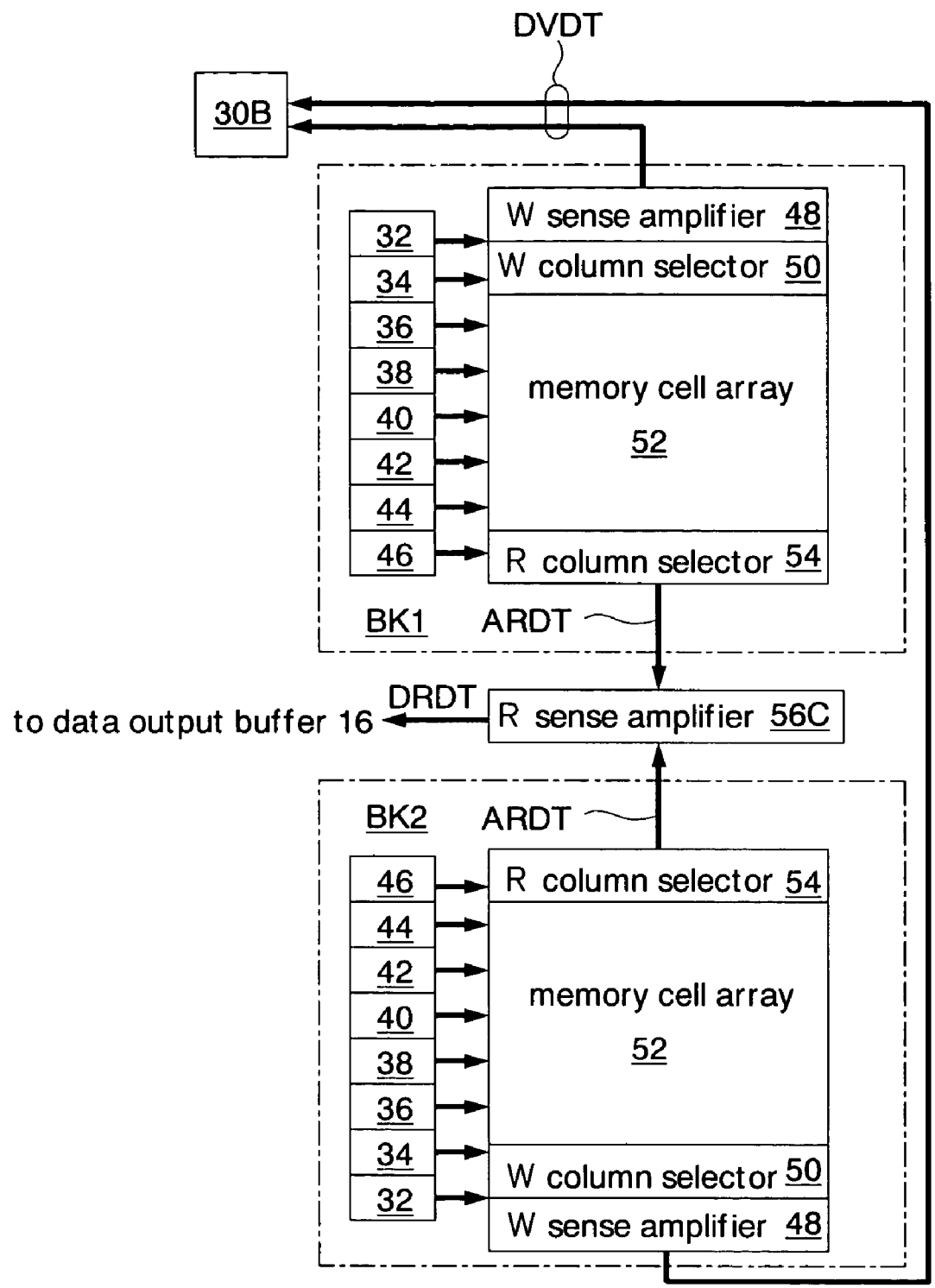
FIG. 12 is a block diagram showing details of a bank shown in FIG. 11.

FIG. 12 shows details of the banks BK1, BK2 shown in FIG. 11.

The R column selectors 54 of the banks BK1, BK2 output an analog read data signal ARDT to the common R sense amplifier 56C formed outside the banks BK1, BK2. The R sense amplifier 56C amplifies the analog read data signal ARDT outputted from the bank BK1 or BK2 and outputs the amplified read data as the digital read data signal DRDT.

In this embodiment also, the same effects as those of the first, second and third embodiments described above can be obtained. Also, in this embodiment, by forming an R sense amplifier 56C common to the banks BK1, BK2, it is possible to reduce the size of the banks BK1, BK2. As a result, a triple operation function can be realized in the two banks BK1, BK2, and the chip size of the flash memory can be reduced. And, by forming the R sense amplifier 56C common to the banks BK1, BK2, it is possible to reduce the number of sense amplifiers and it is possible to render a circuit corresponding to the multiplexer 60B of the third embodiment unnecessary. As a result, the chip size of the flash memory can be reduced further.

Figure 13:
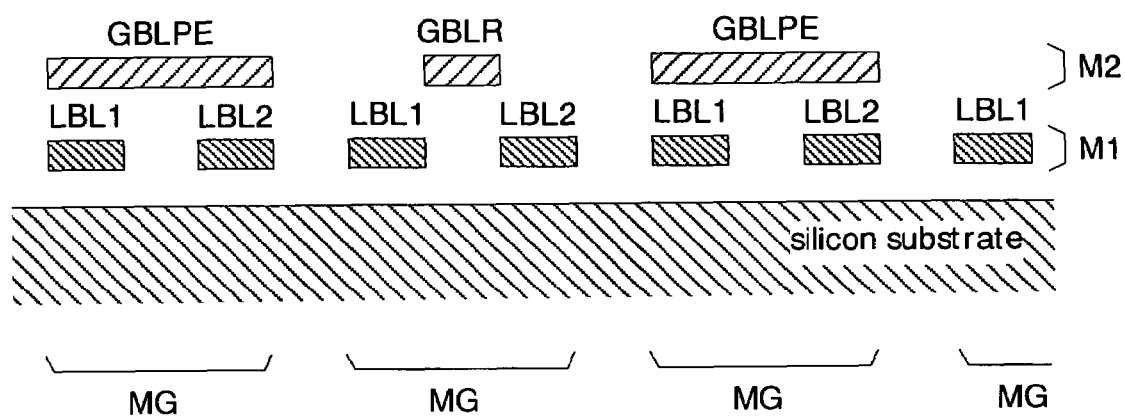
FIG. 13 is a sectional view showing another example of a wiring structure of a memory cell array.
Figure 14:
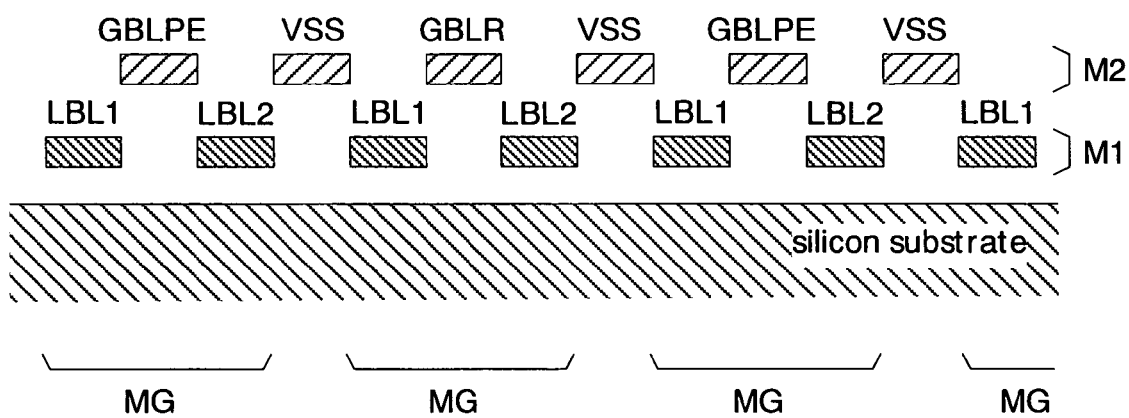
FIG. 14 is a sectional view showing another example of a wiring structure of a memory cell array.

In the second embodiment described above (FIG. 8), an example was discussed in which the shield lines VSS are wired between the global bit lines GBLPE, GBLR. However, the invention is not limited to this. For example, as shown in FIG. 13, the wiring spacing of the global bit lines GBLPE, GBLR may be made large, and the wiring width of the global bit lines GBLPE also made wider than the wiring width of the global bit lines GBLR. By making the wiring width of the global bit lines GBLPE, which transmit a high voltage (drain voltage VD; 5V) during the write operation, wide, it is possible to shorten the write operating time while reducing signal interference. Because the write operation is executed multiple times in a write sequence, by shortening the write operating time it is possible to greatly shorten the write sequence time. Or, reversely to FIG. 13, by making the wiring width of the global bit lines GBLR wider than that of the global bit lines GBLPE, it is possible to greatly shorten the read operating time. Or, as shown in FIG. 14, the local bit lines LBL1, LBL2 formed in a first the metal wiring layer M1 and the global bit lines GBLPE, GBLR and the shield lines VSS formed in the second metal wiring layer M2 may be mutually staggered (so that the overlaps between them seen from above are small). In this case, because the facing area of the local bit lines LBL1, LBL2 and the global bit lines GBLPE, GBLR decreases, cross-talk noise produced between the interconnections can be reduced.

In the embodiments described above, examples were discussed in which the thicknesses of the gate insulating films of the column switches of the W column selector 50 and the R column selector 54 were made different. However, the invention is not limited to this. For example, by making the ratio W/L (transistor size) of the gate width W to the channel length L of the column switches of the R column selector 54 larger than the ratio W/L of the column switches of the W column selector 50 and thereby increasing the drivability of the column switches of the R column selector 54, it is possible to increase the switching speed of the column switches of the R column selector 54 and shorten the read operating time further. And, because the layout size of the write bit line selector can be made relatively small, it is possible to minimize any increase in power consumption. As a result, it is possible to make the chip size of the nonvolatile semiconductor memory small without lowering its performance.

In the third embodiment described above, an example was discussed in which the banks BK1, BK2 that are the same as the bank BK of the first embodiment were constructed. However, the invention is not limited to this. For example, the banks BK1, BK2 that are the same as the bank BK of the second embodiment may be constructed.

In the fourth embodiment described above, an example was discussed wherein the banks BK1, BK2 were constructed as if by removing the R sense amplifier 56 from the bank BK of the second embodiment. However, the invention is not limited to this. For example, alternatively the banks BK1, BK2 may be constructed as if by removing the R sense amplifier 56 from the bank BK of the first embodiment.

In the embodiments described above, examples were discussed in which the invention is applied to the flash memory mounted on the system board. However, the invention is not limited to this. For example, the invention may alternatively be applied to a flash memory core mounted on a system LS1.

In the embodiments described above, examples were discussed wherein the invention is applied to the flash memory of the NOR type. However, the invention is not limited to this. For example, the invention may alternatively be applied to a flash memory of the NAND type. Or the invention may be applied to an EEPROM.

The invention is not limited to the above embodiments and various modifications may be made without departing from the spirit and scope of the invention. Any improvement may be made in part or in all of the components.

What is claimed is:

1. A nonvolatile semiconductor memory comprising a plurality of independently operable banks, each bank including:
    a plurality of sectors, each having a plurality of nonvolatile memory cells and at least one local bit line connected to the memory cell;
    at least one write global bit line, wired commonly to said sectors, that transfers write data to said memory cells during write operation and transfers verify data from said memory cells during verify operation after write operation and after erase operation;
    at least one read global bit line, wired commonly to said sectors, that transfers read data from said memory cells during read operation; and
    a plurality of switch circuits, formed in said sectors respectively, that connect said local bit line to said write global bit line or said read global bit line according to operation modes;
    a verify sense amplifier that, during said verify operation, amplifies verify data read to said write global bit line from one of said memory cells; and
    a read sense amplifier that, during said read operation, amplifies read data read to said read global bit line from one of sad memory cells, wherein
    said read sense amplifier has drivability higher than that of said verify sense amplifier.

2. The nonvolatile semiconductor memory according to claim 1, wherein said read sense amplifier common to said banks and selectively connected to the read global bit line of one of said banks selected in accordance with an address signal.

3. The nonvolatile semiconductor memory according to claim 1, wherein said switch circuits include
    a plurality of write global selection switches each for connecting said local bit line to said write global bit line; and
    a read global selection switches each for connecting said local bit line to said read global bit line.

4. The nonvolatile semiconductor memory according to claim 3, wherein each of said banks includes:
    a write decoder that, during said write operation and during said verify operation, generates in accordance with an address signal a write decoding signal for turning on said write global selection switch; and
    a read decoder that, during said read operation, generates in accordance with an address signal a read decoding signal for turning on said read global selection switch.

5. The nonvolatile semiconductor memory according to claim 4, wherein:
    said write global selection switch is a transfer transistor receiving said write decoding signal at its gate; and
    said read global selection switch is a transfer transistor receiving said read decoding signal at its gate.

6. The nonvolatile semiconductor memory according to claim 1, wherein each of said banks includes:
    a write bit line selector that connects the write global bit line to a write data bus line in accordance with an address signal; and
    a read bit line selector that connects the read global bit line to a read data bus line in accordance with an address signal.

7. The nonvolatile semiconductor memory according to claim 6, wherein:
    said write bit line selector includes write switch transistors that each connect the write global bit line to said write data bus line;
    said read bit line selector includes read switch transistors that each connect the read global bit line to said read data bus line; and
    said write switch transistors have gate insulating films thicker than those of said read switch transistors.

8. The nonvolatile semiconductor memory according to claim 1, wherein each of said banks includes:
    a plurality of global bit line pairs, each configured of one write global bit line and one read global bit line; and
    a plurality of local bit line pairs, each configured by a pair of said local bit lines, wherein
    said global bit line pairs are wired along said local bit lines and are wired in correspondence with said local bit line pairs.

9. The nonvolatile semiconductor memory according to claim 8, wherein said write global bit line and said read global bit line of each of said global bit line pairs are wired, using a second wiring layer, above said local bit lines of said local bit line pairs which are wired using a first wiring layer.

10. The nonvolatile semiconductor memory according to claim 1, wherein:
    each of said banks includes source lines each wired independently for each of said sectors; and
    said sectors are smallest erase units for erasing data written to said memory cells.

11. A nonvolatile semiconductor memory, comprising:
    a plurality of sectors, each having a plurality of memory groups each composed of a local bit line pair and nonvolatile memory cells connected to both local bit lines of the local bit line pair, respectively;
    a write global bit line, wired commonly to said sectors, that transfers write data to said memory cells during a write operation and transfers verify data from said memory cells during a verify operation after the write operation and after an erase operation;
    a read global bit line, wired commonly to said sectors, that transfers read data from said memory cells during read operation; and a plurality of switch circuits, formed in said sectors corresponding to said memory groups, respectively, that each connect both local bit lines of the local bit line pair to said write global bit line or said read global bit line according to operation modes, wherein said switch circuits each include:

a local selection switch pair that is connected to said local bit line pair, respectively, to connect one of said local bit line pair to a common node;

a write global selection switch that connects said common node to said write global bit line according to operation modes; and a read global selection switch that connects said common node to said read global bit line according to operation modes, wherein:

the write global selection switches corresponding to the memory groups adjacent to each other are connected to a common write global bit line; and the read global selection switches corresponding to the memory groups adjacent to each other are connected to a common read global bit line.

12. The nonvolatile semiconductor memory according to claim 11, further comprising a plurality of shield lines set to a predetermined voltage, each wired between said write global bit line and said read global bit line, wherein in each of said memory groups, one of said write global bit line and said read global bit line is wired over one of said local bit line pair and the shield line is wired over the other one of said local bit line pair.

13. The nonvolatile semiconductor memory according to claim 11, wherein:

said memory groups are arranged in one direction orthogonal to said read and write global bit lines in each of said sectors;

the write global selection switch and the read global selection switch corresponding to each of said memory groups are arranged in the one orthogonal direction;

the write global selection switches and the read global selection switches respectively corresponding to the memory groups adjacent to each other are arranged in reverse order to one another;

the write global selection switch in each of said memory groups and the write global selection switch in the memory group adjacent thereto on one side are connected to a common write global bit line; and the read global selection switch in each of said memory groups and the read global selection switch in the memory group adjacent thereto on the other side are connected to a common read global bit line.

14. A nonvolatile semiconductor memory comprising a plurality of independently operable banks, each bank including:

a plurality of sectors, each having a plurality of memory groups composed of a local bit line pair and a plurality of nonvolatile memory cells connected to both local bit lines of the local bit line pair, respectively;

a write global bit line, wired commonly to said sectors, that transfers write data to said memory cells during write operation and transfers verify data from said memory cells during verify operation after write operation and after erase operation;

a read global bit line, wired commonly to said sectors, that transfers read data from said memory cells during read operation; and a plurality of switch circuits, formed in said sectors corresponding to said memory groups, respectively, that each connect both local bit lines of the local bit line pair to said write global bit line or said read global bit line according to operation modes, wherein said switch circuits each include:

a local selection switch pair that is connected to said local bit line pair, respectively, to connect one of said local bit line pair to a common node;

a write global selection switch that connects said common node to said write global bit line according to operation modes; and a read global selection switch that connects said common node to said read global bit line according to operation modes, wherein:

the write global selection switches corresponding to the memory groups adjacent to each other are connected to a common write global bit line; and the read global selection switches corresponding to the memory groups adjacent to each other are connected to a common read global bit line.

15. The nonvolatile semiconductor memory according to claim 14, further comprising a plurality of shield lines set to a predetermined voltage, each wired between said write global bit line and said read global bit line, wherein in each of said memory groups, one of said write global bit line and said read global bit line is wired over one local bit line of the local bit line pair and the shield line is wired over the other local bit line of the local bit line pair.

16. The nonvolatile semiconductor memory according to claim 14, wherein:

said memory groups are arranged in a direction orthogonal to said read and write global bit lines in each of said sectors;

the write global selection switch and the read global selection switch corresponding to each of said memory groups are arranged in the one orthogonal direction;

the write global selection switches and the read global selection switches respectively corresponding to the memory groups adjacent to each other are arranged in reverse order to one another;

the write global selection switch in each of said memory groups and the write global selection switch in the memory group adjacent thereto on one side are connected to a common write global bit line; and the read global selection switch in each of said memory groups and the read global selection switch in the memory group adjacent thereto on the other side are connected to a common read global bit line.

* * * * *